United States Patent

Nguyen et al.

[11] Patent Number: 5,912,316
[45] Date of Patent: Jun. 15, 1999

[54] FLEXIBLE INTERPENETRATING NETWORKS FORMED BY EPOXY-CYANATE ESTER COMPOSITIONS VIA A POLYAMIDE

[75] Inventors: Guy P. Nguyen; Carl Edwards, both of San Diego, Calif.

[73] Assignee: Johnson Matthey, Inc., Valley Forge, Pa.

[21] Appl. No.: 08/859,792

[22] Filed: May 19, 1997

Related U.S. Application Data

[60] Provisional application No. 60/030,242, Nov. 8, 1996.

[51] Int. Cl.$^6$ .................................................... C08G 59/56
[52] U.S. Cl. .............................. 528/93; 528/94; 528/99; 528/117; 528/327
[58] Field of Search ................... 528/93, 94, 99, 528/117, 327

[56] References Cited

U.S. PATENT DOCUMENTS

| | | | |
|---|---|---|---|
| 3,553,244 | 1/1971 | Grigat et al. | 260/453 |
| 4,393,195 | 7/1983 | Gaku et al. | 528/361 |
| 4,552,690 | 11/1985 | Ikeguchi et al. | 252/512 |
| 4,604,452 | 8/1986 | Shimp | 528/422 |
| 4,785,075 | 11/1988 | Shimp | 528/422 |
| 4,797,454 | 1/1989 | Ryang | 525/476 |
| 4,902,752 | 2/1990 | Shimp | 525/390 |
| 4,956,393 | 9/1990 | Boyd et al. | 521/54 |
| 4,983,683 | 1/1991 | Shimp | 525/390 |
| 5,043,411 | 8/1991 | Ho et al. | 528/99 |
| 5,068,309 | 11/1991 | Shimp et al. | 528/211 |
| 5,086,088 | 2/1992 | Kitano et al. | 522/170 |
| 5,149,863 | 9/1992 | Shimp et al. | 560/301 |
| 5,203,076 | 4/1993 | Kingshuk et al. | 29/840 |
| 5,218,234 | 6/1993 | Thompson et al. | 257/787 |
| 5,262,232 | 11/1993 | Wilfong et al. | 428/327 |
| 5,330,684 | 7/1994 | Emori et al. | 252/512 |
| 5,331,018 | 7/1994 | McGinniss et al. | 522/16 |
| 5,450,283 | 9/1995 | Lin et al. | 361/704 |
| 5,467,424 | 11/1995 | Davies et al. | 392/401 |
| 5,481,187 | 1/1996 | Marcott et al. | 324/207.16 |
| 5,492,863 | 2/1996 | Higgins | 438/610 |
| 5,494,981 | 2/1996 | Gorodisher et al. | 525/504 |
| 5,495,450 | 2/1996 | Zollo et al. | 365/218 |
| 5,515,467 | 5/1996 | Webb | 385/88 |
| 5,578,904 | 11/1996 | Marcott et al. | 324/207.16 |
| 5,583,378 | 12/1996 | Marrs | 257/710 |
| 5,600,237 | 2/1997 | Nippert | 324/207.16 |
| 5,621,225 | 4/1997 | Shieh et al. | 257/81 |

*Primary Examiner*—Frederick Krass
*Attorney, Agent, or Firm*—Christie, Parker & Hale, LLP

[57] ABSTRACT

A resin composition, for use as a die attach adhesive, heat sink attach adhesive, encapsulant or underfill, comprises a resin system, including a mixture of an epoxy resin and a cyanate ester resin, and a polyamide catalyst. The composition is curable in one minute at 200° C. and has a pot life of at least 18 hours at room temperature. The resin composition is flexible, develops high adhesion, high moisture resistance, low weight loss during curing and requires no solvents.

45 Claims, 4 Drawing Sheets

FLEXIBLE INTERPENETRATING NETWORKS FORMED BY EPOXY-CYANATE ESTER COMPOSITIONS VIA A POLYAMIDE

This application claims the benefit of U.S. Provisional Application No. 60/030,242, filed Nov. 8, 1996.

BACKGROUND OF THE INVENTION

The present invention relates to a resin composition useful in the formulation of die attach adhesives, heat slug adhesives, encapsulants and underfills in the manufacture of semiconductor devices.

As uses for semiconductor devices continue to increase, there is a growing demand for adhesive compositions and resin formulations useful in the manufacture of such semiconductor devices. Adhesives are used, for example, to attach dies and heat slugs to semiconductor packages under a variety of conditions. Underfills are used to reduce thermal stress between the substrate, i.e., package, and the die interface. Encapsulants are used to completely encapsulate, seal and bond a die to a semiconductor package.

To be useful in the manufacture of semiconductor devices, adhesives, underfills, encapsulants and the like must meet certain performance, reliability and manufacturability requirements as dictated by the particular application. Performance properties for which there are typically minimum requirements include adhesion, coefficient of thermal expansion, flexibility, temperature stability, moisture resistance and the like. Reliability requirements are typically evaluated by the ability to pass thermal cycling and/or HAST tests or the like without delamination or other failure. Manufacturability requirements generally include specific requirements for rheology, cure rates and usable pot life and the like.

Resin compositions comprising cyanate ester and epoxy resins have been demonstrated to be useful as die attach adhesives, underfills and encapsulants. While the performance characteristics for such resin compositions are adequate for some applications, there is a continuing need to improve reliability and manufacturing performance of the compositions. Currently available composition address some, but not all, of the following performance criteria: long pot life, fast cure, adequate mechanical flexibility, low moisture absorption and high adhesion. Currently available materials tend to exhibit high rigidity, too short a pot life (generally less than 8 hours), and too long of a cure schedule, e.g., cure time is too long (175° C. for more than 1 or 2 hours.

SUMMARY OF THE INVENTION

The present invention provides a cyanate ester/epoxy resin composition which is snap curable and is stable, i.e. has a long pot life, at room temperature. The composition comprises a resin system which includes a mixture of at least one epoxy resin, preferably at least one multifunctional aromatic epoxy resin, and a cyanate ester resin, preferably a multifunctional cyanate ester resin. The resin composition further comprises an initiator, preferably a polyamide catalyst.

The epoxy resin is present in an amount of from about 5 to about 95%, preferably from about 10 to about 70% and more preferably from about 30 to about 60% by weight of the resin system. The cyanate ester is present in an amount of from about 5 to about 80%, preferably from about 10 to about 60% and more preferably from about 20 to about 40% by weight of the resin system. The polyamide catalyst is present in an amount of from about 5 to about 30 and preferably from about 7 to about 15 parts per 100 parts of the resin system.

The composition is curable within one minute at or above some threshold temperature above room temperature, e.g., 200° C. It has a pot life of at least 18 hours at room temperature. It is flexible, develops high adhesion which is stable at high temperatures, has high moisture resistance, low weight loss during curing and does not require the use of solvents or diluents.

The resin composition is particularly suitable for use in electronic applications, e.g., in formulating die attach adhesives, encapsulants for semiconductor devices in so-called "glob top" assemblies, or underfills for electronic devices in semiconductor assemblies. In addition, the resin composition is suitable for use in formulating adhesives for heat sink or heat slug attachment in connection with semiconductor packaging.

BRIEF DESCRIPTION OF THE DRAWINGS

These and other features and advantages of the present invention will be better understood by reference to the following detailed description when considered in conjunction with the accompanying drawings, wherein.

DETAILED DESCRIPTION

Figure 1:
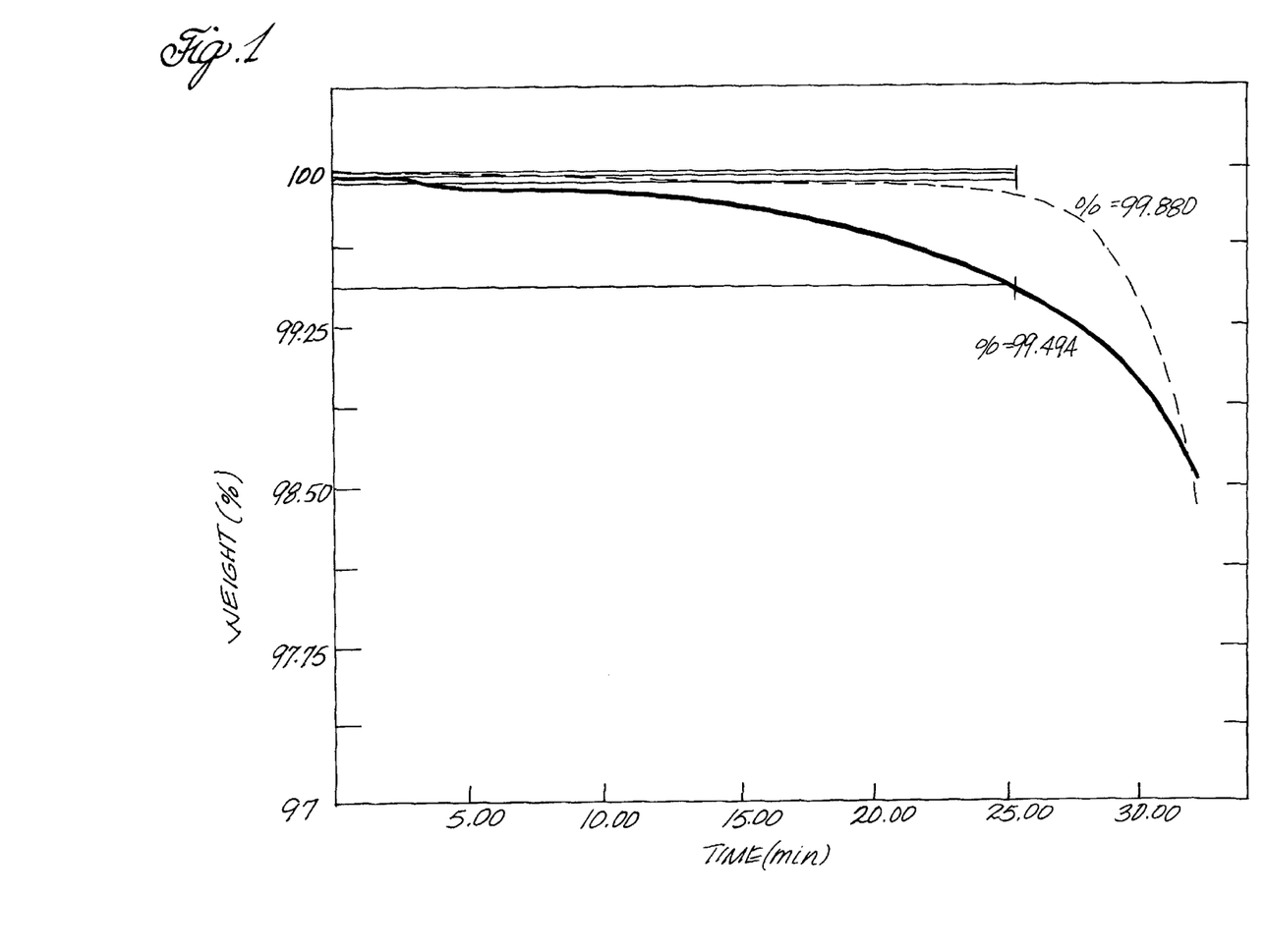
FIG. 1 is a graph of a thermal gravimetric analysis (TGA) of the composition of Example 1 indicating low weight loss during curing.
Figure 2:
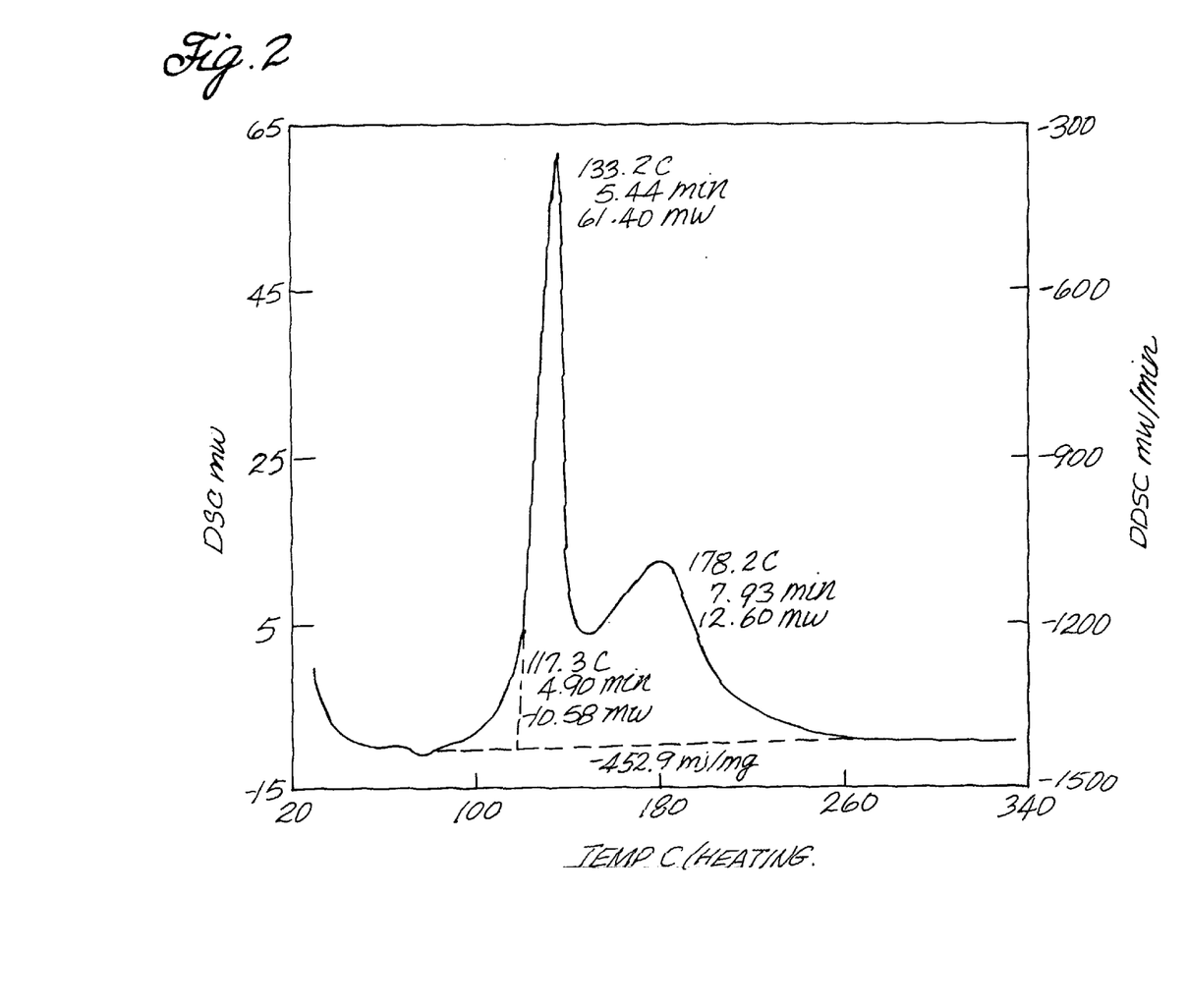
FIG. 2 is a graph of a differential scanning colorimetry analysis (DSCA) showing low temperature curability of the composition of Example 1.
Figure 3:
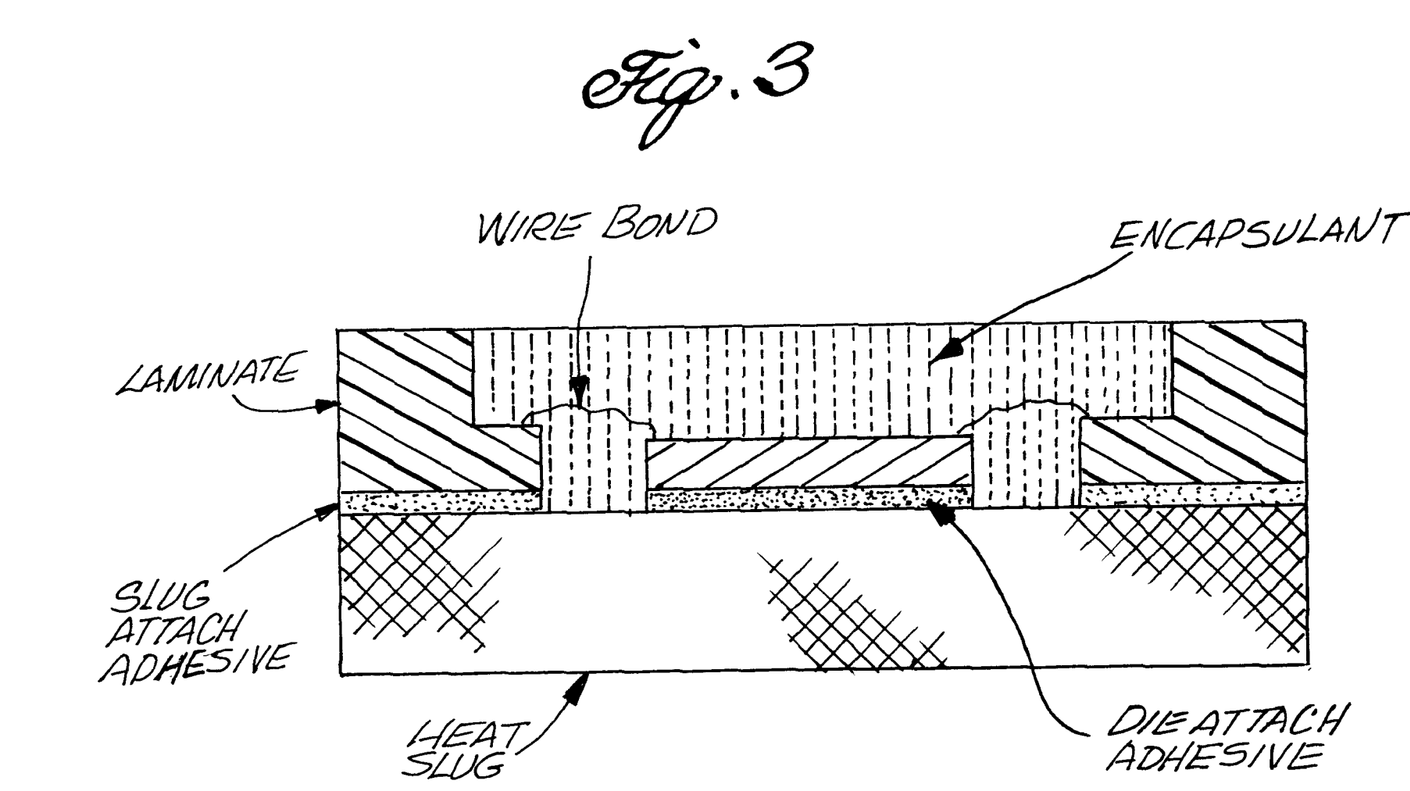
FIG. 3 is a cross-sectional schematic diagram showing an example of the composition of Example 1 in a finished semiconductor assembly wherein a heat slug is attached to a laminate assembly.
Figure 4:
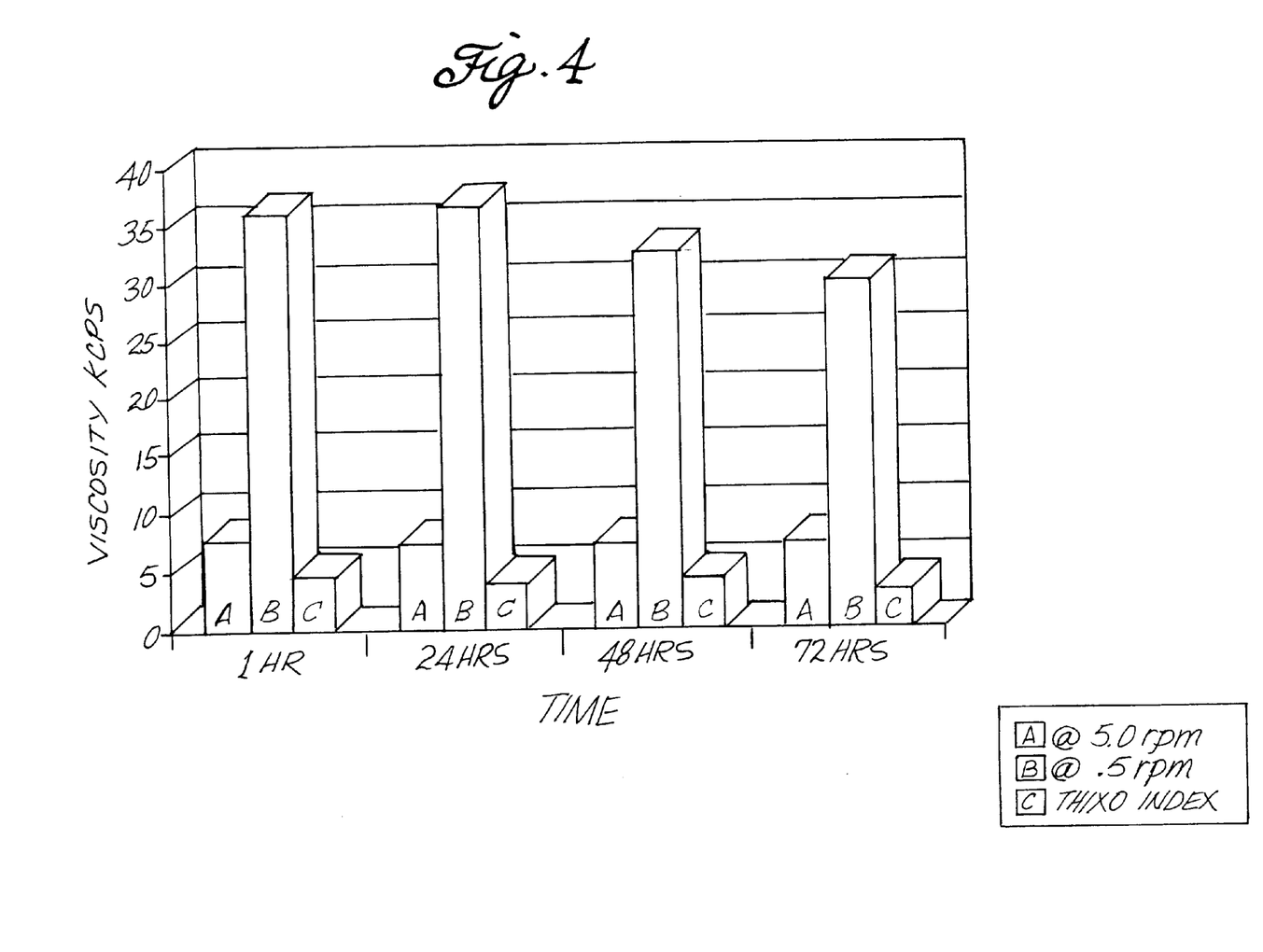
FIG. 4 is a graph showing the stability of the composition of Example 1 at room temperature.

In accordance with the present invention, there is provided a snap curable cyanate esterepoxy resin composition which is stable at room temperature and which is suitable for high volume manufacturing of semiconductor assemblies.

As used herein, "snap curable" refers to a resin which may be cured within about one minute at some threshold temperature, above room temperature.

As used herein, a polymer is said to be "cured" when useful mechanical strength and adhesive properties are developed. For example, dicyanate monomers develop useful polymer properties when about 85% or more of the cyanate functional groups have reacted to form triazine rings.

As used herein, the phrases "stable at room temperature" and "long pot life" mean that the resin composition remains usable for its particular application for at least 18 hours at 25° C.

The resin composition comprises a resin system and a polyamide catalyst. The resin system includes at least one epoxy resin and at least one cyanate ester resin. The specific epoxy and cyanate ester resins used must, in combination with the catalyst and other components, if any, be liquid at room temperature. For example, solid epoxy and/or cyanate esters may be dissolved in a reactive liquid resin.

Preferably, the epoxy resin comprises at least one polyfunctional aromatic epoxy resin. Preferred aromatic epoxy resins include bisphenol A and bisphenol F epoxy resins. Non-limiting examples of other aromatic epoxy resins useful in the present invention include epoxy novolac resins. Instead of or in addition to the aromatic epoxy resin, multifunctional aliphatic epoxy resins may be used. Preferred multifunctional aliphatic epoxy resins include flexible resins such as epoxy terminated polyethers, e.g. Heloxy 71 from Shell Chemicals, epoxy terminated polyacrylates, and epoxy terminated polyesters and epoxy terminated siloxanes.

The cyanate ester component of the resin system preferably comprises at least one multifunctional cyanate ester resin. Preferred multifunctional cyanate ester resins include 1,1'-bis(4-cyanatophenyl) ethane, e.g. L-10 from Ciba Geigy bis(4-cyanato-3,5-dimethylphenyl) methane, e.g. M-10 from Ciba Geigy, 2,2'-bis(4-cyanatophenyl) isopropylidene, e.g. B-10 from Ciba Geigy, and the like.

The epoxy resin tends to impart toughness and flexibility to the cured resin composition. The cyanate ester resin tends to impart good moisture resistance and high adhesion to the cured resin composition. Together, the epoxy and cyanate ester resins provide a rapidly curable composition, which when cured, forms an interpenetrating cross linked network.

The epoxy resin is preferably present in the resin system in an amount of from about 5 to about 95% by weight, more preferably from about 10 to about 70% by weight and most preferably from about 30 to about 60% by weight. Less than about 5% epoxy resin is not preferred because curing is too slow. Greater than about 95% of the epoxy resin is not preferred because such compositions tend to exhibit reduced moisture resistance and adhesion. Amounts of epoxy resin in the range of from about 10% to about 70% and particularly from about 30 to about 60% by weight of the resin system are preferred because such amounts tend to exhibit the best combination of features including flexibility, adhesion, and moisture resistance.

The cyanate ester resin is preferably present in the resin system in an amount of about 5% to about 80% by weight, preferably about 10% to about 60% by weight and more preferably from about 20% to about 40% by weight of the resin system. Amounts of cyanate ester below about 5% by weight of the resin system are not preferred because such compositions tend to exhibit reduced adhesion and moisture resistance properties. Amounts of cyanate ester resin greater than about 80% by weight of the resin system are not preferred because such cured compositions tend to be too rigid and curing times tend to be slow. Amounts of cyanate ester in the range of from about 10 to about 60% and particularly from about 20 to about 40% by weight of the resin system are preferred because such amounts tend to exhibit the best combination of adhesion, moisture resistance, and flexibility.

The polyamide catalyst preferably comprises at least one compound having the formula:

where n and M are at least 1. The presently preferred polyamide catalysts are marketed by Ciba Geigy under the trade designations HT 9506.

The polyamide catalyst is present in an amount of from about 5 to about 30 parts per 100 parts of the resin system and preferably from about 7 to about 15 parts per 100 parts of the resin system. The amount of catalyst affects the speed of cure and lowers the curing temperature. Amounts of catalyst below about five parts per 100 parts of the resin system are not preferred because the cure time tends to be too slow and/or the required curing temperature tends to be undesirably high. Amounts of catalyst greater than about 30 parts per 100 parts of the resin system are not preferred because uncured compositions having such amounts tend to exhibit undesirably high viscosity, and high weight loss during cure and the resulting cured composition tends to exhibit reduced adhesion. About 7 to about 15 parts catalyst per 100 parts of the resin system are particularly preferred because the compositions can be cured first, i.e., snap cured without adversely affecting properties of the cured composition, such as adhesion flexibility and moisture resistance, and while maintaining a long pot life.

The resin composition is capable of being cured at less than 110° C., e.g., around 100° C., and of gelling in about 3 minutes at 175° C. The resin composition is snap curable, i.e., curable within one minute at or above a threshold temperature which will depend on the precise resin composition and the amount of catalyst. Preferably, the composition is curable within one minute at 200° C., more preferably within 30 seconds at 200° C. and even more preferably within about 15 seconds at 200° C. The resin composition is stable at room temperature, having a pot life at room temperature of at least about 18 hours, preferably at least about 24 hours, more preferably at least about one week, and even more preferably at least about two weeks.

When cured, the resin composition crosslinks rapidly and produces a high degree of cross-linking, preferably at least about 90%, to form an interpenetrating cross-linked network resulting in a flexible, high strength, high moisture resistant, high temperature resistant adhesive material.

While not being bound by theory, it is believed that the polyamide catalyst has one or more active hydrogens which are stearically hindered at room temperature, i.e., one or more active hydrogens which are blocked or "hidden" within the structure at room temperature. At elevated temperatures, the shape of the polyamide catalyst changes sufficiently to expose the active hydrogens. The catalyst is believed to attach to the epoxy molecule and the reaction product then attaches to the cyanate ester thus accelerating curing of the epoxy and cyanate ester. As a result, the cyanate ester and epoxy resins are cured to form an interpenetration network.

The resin composition of the present invention produces unexpected results as compared to cyanate ester/epoxy formulations which are cured with use of a conventional metal or amine catalyst. The use of a metal catalyst results in a rigid adhesive having a high modulus when cured. Metal catalyst-containing formulations tend to require relatively high temperatures and relatively long times for curing. They also have a very short pot life. The resultant rigidity, long cure times, short pot life and processing requirements limit usefulness in the manufacture of semiconductor assemblies.

Amine curing catalysts perform differently than metal catalysts in that they react violently with cyanate esters, even at room temperature. A rapid curing cyanate ester-containing formulation using an amine catalyst tends to have a very short pot life. Because of the high reactivity, such formulations tend to result in voids in the cured composition.

The cured resin composition of the present invention provides a unique combination of properties including high adhesion, high moisture resistance, good flexibility and high temperature stability and excellent reliability. Moreover, the present invention provides a means to modify properties, such as adhesion, flexibility, moisture resistance and the like and also vary the cure conditions.

Cured resin compositions preferably have an adhesion of at least about 30 Kg as measured by a die shear test using a 200×200 mil silicone die bonded to a copper lead frame. Cured resin compositions preferably have a moisture absorption of less than about 1% when subjected to a HAST test at 150° C. for 100 hours. Flexibility as measured by radius of curvature is preferably within the range of from 0.5 to 2 meters. Cured resin compositions preferably can withstand 85% relative humidity at 85° C. for 1000 hours without delamination.

The above properties tend to be superior to conventionally cured cyanate ester/epoxy formulations and meet or exceed industry requirements. The resulting compositions have adhesive properties as good or better than conventional cyanate ester containing adhesives and better adhesion than conventional epoxy adhesives due to the high degree of crosslinking, e.g., at least about 90%. The high degree of crosslinking of the cured resin composition results in superior moisture resistance. The resin compositions are also more flexible than cyanate ester resins. The compositions have high temperature stability.

The resin composition may comprise additional polymerizable components or other ingredients. Additional polymerizable components may include, for example, one or more flexibilizer resins in an amount of up to about 30 parts per 100 parts of the resin system, and low molecular weight reactive diluents to modify rheology in amounts up to about 30 parts per 100 parts of the resin system. Preferred flexibilizer resin includes polyacrylates, e.g., acrylate elastomer type XU717 polyether from Dow Chemical, polyesters preferably terminated with epoxy functionalities, silanes, preferably polysiloxanes terminated with epoxy functionalities, and epoxy terminated polyacrylates and polyethers. Non-limiting examples of diluents include epoxy type butyl glycidyne ether, acrylates, and the like. An organo functional silane, e.g. Z6040 Silane from Dow Corning, can be incorporated into the composition as an adhesion promoter.

Additional non-polymerizable ingredients may include a stabilizer or anti-bleed agent such as a fatty acid, e.g. ARMAK 1363 from Akzo, and the like; agents to modify the rheology of the uncured resin composition such as silica, fumed silica, boron nitride, carbon fiber; agents to modify the coefficient of thermal expansion (CTE) such as fumed silica; fillers to impart thermal or electrical conductivity such as metal particles and flakes, particularly silver particles and flakes; gold, carbon powder and the like.

While solvents are not preferred, a small amount, e.g., less than 10 parts per 100 parts of the resin system, may be used to control rheology or the like if desired. Solvents are not preferred because their presence tends to result in voids in the cured composition, excessive weight loss during cure and may adversely affect adhesion reliability.

The resin compositions of the present invention are particularly useful in the manufacture of semiconductor devices. Specifically, the resin compositions of the present invention are useful in formulating adhesives for attaching heat slugs to semiconductor packages, in formulating conductive and nonconductive die attach adhesives, and in formulating underfills and encapsulants.

Heat Slug Adhesives

Certain semiconductor devices such as high frequency CPU chips operate in high power environments. When a device draws high power during operation, heat is produced. If the heat is not removed from the device, the chip also heats up and as a result, slows down. A slow semiconductor is undesirable in the marketplace, so efficient heat removal is desirable. One technique to remove heat is to build a heat slug or heat sink into the package, to which the semiconductor die can be directly attached.

For plastic laminate grid array packages (PLGA), attachment of an all-metal heat slug to the plastic package requires that-the adhesive have properties that provide suitable package performance and manufacturability. These properties include a balance of thermal coefficient of expansion between laminate and slug to minimize stress on the laminate and maximize adhesive performance. A material having this combination must also pass various environmental tests required by the electronics industry. These tests include thermal cycling, high temperature moisture exposure and electrical bias testing. Typically, semiconductor devices must survive these tests without mechanical degradation (delamination) or electrical degradation.

Heat slug adhesives suitable for use in semiconductor packaging comprise the resin composition of the present invention and typically a filler, e.g., silica, boron nitride, carbon fiber and the like, for modifying the coefficient of thermal expansion (CTE) and in some cases the thermal conductivity of the cured adhesive. It is desired that the CTE of the adhesive be close to and preferably between the CTE's of the heat slug and the material of the semiconductor packaging to which the heat slug is attached. Typically a CTE in the range of 25 to 35 ppm will be preferred. The heat slug adhesives of the present invention not only provide excellent performance as a cured adhesive, but permit manufacturing flexibility in heat sink applications. For example, the adhesive may be screen or stencil printed on the laminate semiconductor package followed by high speed slug insertion.

Die Attach Adhesives

Die attach adhesives are used to attach semiconductor chips, i.e., to lead frames. Such adhesives must be able to be dispensed in small amounts at high speed and with sufficient volume control to enable the adhesive to be deposited on a substrate in a continuous process for the production of bonded semiconductor assemblies. Rapid curing of the adhesives is very desirable. It is also important that the cured adhesives demonstrate high adhesion, high thermal conductivity, high moisture resistance and temperature stability and good reliability.

Conductive die attach adhesives prepared in accordance with the present invention comprise the resin composition of the present invention and at least one conductive filler. Electrically conductive adhesives typically include at least one type of silver flake. Other suitable electrically conductive fillers include silver powder, gold powder, carbon black and the like. For a thermally conductive adhesives (without electrical conductivity) fillers such as silica, boron nitride, diamond, carbon fibers and the like may be used. The amount of electrically and/or thermally conductive filler is sufficient to impart conductivity to the cured adhesive, preferably an amount of from about 20% to about 90% by weight and more preferably from about 40% to about 80% percent by weight. In addition to the electrically and/or thermally conductive filler, other ingredients such as adhesion promoters, anti-bleed agents, rheology modifiers, flexibilizers and the like may be present.

Encapsulants

Encapsulants are resin compositions which are used to completely enclose or encapsulate an electronic component. An encapsulant prepared in accordance with the present invention comprises the resin composition of the present invention and non-conductive fillers such as silica, boron nitride, carbon filer and the like. Such encapsulants preferably provide excellent temperature stability, e.g., able to withstand thermocycling from −65° C. to 150° C. for 1000 cycles; excellent temperature storage, e.g., 1000 hours at 150° C.; are able to pass a pressure cooker test at 121° C. at 14.7 psi for 200 to 500 hours with no failures, and are able to pass a HAST test at 140° C., 85% humidity at 44.5 psi for 25 hours with no failures.

Underfills

Underfill materials are used in flip-chip devices to fill the space between the flip chip and substrate. The underfill material environmentally seals the active surface of the flip chip as well as the electrical interconnections. It also provides an additional mechanical bond between the flip chip and the substrate and prevents excessive stress on the small electrical interconnects between the chip and the substrate. The underfill material is typically an epoxy resin with inert fillers. The viscosity is adjusted to provide proper flow characteristics to allow complete filling of the space.

An underfill prepared in accordance with the present invention comprises the resin composition of the present invention and one or more inert fillers. Such underfills preferably provide excellent moisture resistance and high adhesion.

EXAMPLE 1

A non-electrically conductive heat slug adhesive composition was formulated containing the components described in Table 1 in the amounts indicated. Table 1 below describes the commercial designation, the chemical composition, the source of the component and the amounts in the formulation of this example.

TABLE 1

| Trade Designation | Chemical | Source | Amount |
|---|---|---|---|
| L10 | Cyanate ester | Ciba | 24.3 |
| 830 LVP | Bis Phenol F | Dinippon | 30.4 |
| XB 4122 | Bis Phenol A | Ciba | 30.4 |
| HT 939 | Polyamide | Ciba | 13.7 |
| Armak 1363 | Fatty Acid | Akzo | 0.6 |
| Z6040 | Silane | Dow Corning | 0.6 |
| F3093 | Silica | Nitto Denko | 57% |

The paste was made as follows:

Weigh indicated amounts of L10, 830LVP and XB4122 and introduce to a planetary mixer.

Mix at low rpm (10 rpm) and heat @60° C. for 15 min.

Add ARMAK 1363 and continue mixing until complete dissolution (about 20 min.).

Cool to room temperature.

Add Z6040 and mix for about 5 min. @ 15 rpm.

Add HT 939 and mix for about 15 min. @ 15 rpm.

Add silica and mix @ 20 rpm for about 25 min. while degassing by vacuum to completely remove air from the paste.

Mill in a three roll mill.

The properties of the polymer paste described or cured composition have been determined to be as follows:

Color: yellow

Work life: about 3 weeks

Viscosity: @ 0.5 rpm 172,00 cps
@ 0.5 rpm 35,000 cps

Thixotropy index (ratio of viscosity @ 0.5 rpm by viscosity @ 5 rpm): 4.5

Die shear: 50 bls (80×80 mil silicon die to silver plate and copper lead frame)

Coefficient of thermal expansion: below Tg: 30 ppm
above Tg: 175 ppm

Radius of curvature: 0.8 meter (600×600 mil die)

Glass transition temperature (Tg): 60° C.

Cure condition: oven cure @ 175° C. for 15 minutes.

Weight loss during cure: about 0.1%

EXAMPLE 2

A nonconductive cyanate ester epoxy die attach adhesive was formulated containing the components described in Table 2.

TABLE 2

| Trade Designation | Chemical | Source | Amount |
|---|---|---|---|
| L10 | Cyanate ester | Ciba | 26.9 |
| 830 LVP | Bis Phenol F | Dinippon | 28.0 |
| XB 4122 | Bis Phenol A | Ciba | 12.2 |
| XU 71790-04L | Polyacrylate | Dow Plastics | 25.5 |
| HT 939 | Polyamide | Ciba | 7.0 |
| Z6040 | Silane | Dow Corning | 0.4 |
| F3093 | Silica | Nitto Denko | 65% |

The paste was made as follows:

Weigh indicated amounts of L10, 830LVP, XB4122 and XU71790-04L introduce to a planetary mixer.

Mix at low rpm (10 rpm) for 15 min.

Add Z6040 and mix for 5 min @ 15 rpm.

Add HT939 and mix @ 15 rpm for about 15 min.

Add silica and mix @ 20 rpm for 20 min. while degassing by vacuum to completely remove air from paste.

Mill in three roll mill, degassing by vacuum to remove air from paste.

Properties of the uncured and cured composition are as follows:

Viscosity: @ 0.5 rpm, 72,909 cps
@ 5.0 rpm, 49,807 cps

Radius of curvature (600×600 mil silicon die to copper lead frame): 0.5 meter.

HAST test (Parr bomb 150C for 72 hrs): no delamination

TGA: weightloss @ 100° C.: 0.06
150° C.: 0.20
200° C.: 0.29
250° C.: 0.39
300° C.: 0.69

CTE: below Tg: 30 ppm
above Tg: 83 ppm

Ionic data:
Sodium <1
Ammonium 89
Potassium <1
Fluorine <1
Chlorine 21

Cure, 175° C.: 15 min.

EXAMPLE 3

A high purity, flexible electrical conductive cyanate ester epoxy die attach adhesive for semiconductor application was prepared according to the formulation in Table 3.

TABLE 3

| Trade Designation | Chemical | Source | Amount |
| --- | --- | --- | --- |
| L10 | Cyanate ester | Ciba | 34.5 |
| 830 LVP | Bis Phenol F | Dinippon | 35.0 |
| XB 4122 | Bis Phenol A | Ciba | 20.8 |
| HT 939 | Polyamide | Ciba | 8.5 |
| ARMAK 1363 | Fatty Acid | Akzo | 0.6 |
| Z6040 | Silane | Dow Corning | 0.6 |
| PM 4130 | Silver flake | Johnson Matthey | 77.5% |

The adhesive was made as follows:

Weigh L10, 830LVP, HT939 introduce to planetary mixer.

Mix at low rpm (10 rpm) for 10 min. @ 60° C.

Add ARMAK 1363, mix @ 60° C. until clear (15 min.)

At 25° C. add HT 939, Z6040, mix @ 15 rpm for 10 min.

Add silver PM4130, mix @ 25 rpm for 20 min. while degassing by vacuum to completely remove air from paste.

The properties of the electrical conductive polymer die attach paste and cured adhesive have been determined to be as follows:

Color: Silver

Work life: about 2 weeks

Viscosity: @ 0.5 rpm, 7,200 cps

Volume resistivity: 0.00022 ohm.cm

Die shear: 22 lbs (80×80 mil silicon die to silver plate copper lead frame)

Resin bleed: 1.8 mil (on silver plate copper lead frame)

TGA: % weight loss 0.14%

Conductive die attach adhesive for semiconductor application must be maintained at a low level of ionic contamination to minimize corrosion. This material contains a very low level of ionic contamination.

Ionic data: Sodium 1.0 ppm
  Potassium <1.0 ppm
  Chlorine 8.0 ppm
  Fluorine <1.0 ppm Extract conductivity: 0.90 millisiemens/meter A pH measurement: 5.52

DSC included

Cure 175° C.: 15 min. (or may be cured 15 sec. at 200° C.)

EXAMPLE 4

A nonconductive flexible cyanate ester epoxy die attach adhesive was prepared according to the formulation shown in Table 4.

TABLE 4

| Trade Designation | Chemical | Source | Amount |
| --- | --- | --- | --- |
| L10 | Cyanate ester | Ciba | 24.4 |
| BIS F | Bis Phenol F | Dinippon | 36.3 |
| R1050 | Polyether | Dupont | 27.0 |
| HT 9506 | Polyamide | Ciba | 11.5 |
| Armak 1363 | Fatty acid | Akzo | 0.3 |
| Z6040 | Silane | Dow Corning | 0.5 |
| F3093 | Silica | Nitto Denko | 46.2% |
| TS720 | Fumed silica | Cabot | 0.5% |

The adhesive was prepared according to the following process:

Weigh L10, BIS F, R1050 introduce to planetary mixer.

Mix at low rpm (10 rpm) for 10 min. @ 60° C.

Add ARMAK 1363, mix @ 60° C. until clear (15 min.)

At 25° C. add Z6040, HT9605 mix @ 15 rpm for 10 min.

Add silica: F3090, TS720, mix @ 25 rpm for 30 min. while degassing by vacuum to remove air from paste.

Three roll mill.

Mix in planetary @ 10 rpm, while degassing to completely remove air from paste.

The properties: of the non-conductive die attach adhesive were determined to be as follows:

Viscosity: @ 0.5 rpm 32,768 cps
  @ 5.0 rpm 7,045 cps

Thixo-index: 4.6

Weight loss during cure: 0.7%

$T_g$: 85° C.

Radius of curvature (600×600 silicon die to copper lead frame): 1.6 meter

DSC included

Young modulus: 0.47 Gpas

Die shear (80×80 mil silicon die to silver plated copper lead frame): 50.6 lbs.

Resin bleed <2 mil (silver plated copper lead frame)

Cure 175° C.: 5 min. (or may be cured 15 sec. at 200° C.)

EXAMPLE 5

A high purity nonconductive die attach adhesive for ball grid array (BGA) application was prepared according to the formulation of Table 5.

TABLE 5

| Trade Designation | Chemical | Source | Amount |
| --- | --- | --- | --- |
| L10 | Cyanate ester | Ciba | 37.0 |
| 830 LVP | Bis Phenol F | Dinippon | 33.6 |
| XB4122 | Bis Phenol A | Ciba | 20.0 |
| HT9506 | Polyamide | Ciba | 8.2 |
| ARMAK1363 | Fatty acid | Akzo | 0.6 |
| Z6040 | Silane | Dow Corning | 0.6 |
| F3093 | Silica | Nitto Denko | 52% |
| TS720 | Fumed silica | Cabot | 0.2% |

The adhesive was prepared according to the following process:

Mix L10, 830LVP and XB4122 for 20 minutes at 15 rpm. Slowly increase temperature to 60° C., add ARMAK, Z6040, and mix for 10 min. at 10 rpm. At 25° C., add HT9506 and mix at 15 rpm and vacuum for 20 min. to remove air from paste. Add F3093, TS720, mix and degas for 20 min. at 15 rpm. Three roll mill, degas to remove air from paste.

The properties of the nonconductive die attach adhesive were determined to be as follows:

Viscosity: @ 0.5 rpm 83,560 cps
  @ 5.0 rpm 11,960 cps

Thixo-index: 6.9

$T_g$: 85° C.

Coefficient of thermal expansion (CTE): Below Tg: 41×10°
  Above Tg: 97×10°

Pull adhesion strength (400×500 mil IC)

Si to Au metallization @ 25° C.: 4,325 psi

Radius of curvature (600×600 silicon die to copper lead frame): 1.6 meter

Young modulus: 1,5GPascals

Ionic data: Sodium: 3
  Chloride: 14

Potassium: <1
Fluoride: <1
Extract conductivity: 2.4 μmhos/cm
pH: 6.9
Cure 175° C.: 15 min. (or may be cured 15 sec. at 200° C.)

EXAMPLE 6

The composition of Example 1 was prepared and snap cured under nitrogen at 30 and 60 seconds at 200° C. Die shear adhesion was tested on twelve 200×200 mil die attached to a silver plate copper lead frame. The parts were tested for die shear on a Dage Model No. 2400P.C. instrument. The results are shown in Table 6 below.

TABLE 6

| Cure Temp | 200° | 200° |
|---|---|---|
| Cure Time | 30 sec. | 60 sec. |
| Cure Type | ASM Oven | ASM Oven |
| Adhesion | 20.34 | 26.70 |
| (Kg) | 18.52 | 5.78 |
|  | 6.85 | 5.34 |
|  | 18.27 | 5.12 |
|  | 20.33 | 10.69 |
|  | 16.05 | 10.23 |
|  | 13.33 | 8.65 |
|  | 14.12 | 21.69 |
|  | 17.42 | 14.38 |
|  | 17.53 | 15.55 |
|  | 16.52 | 18.20 |
|  | 16.20 | 35.32 |
| Avg. | 11.39 Kg | 14.803 Kg |
| Std. Dev (%) | 3.66 | 9.36 |
| Low | 6.85 | 5.78 |
| High | 20.34 | 35.32 |

The adhesives above were cured, i.e., had developed useful mechanical strength and adhesive properties, in 30 and 60 seconds at 200° C.

The preceding description has been presented with reference to presently preferred embodiments of the invention. Workers skilled in the art and technology to which this invention pertains will appreciate that alterations and changes in the described structure may be practiced without meaningfully departing from the principal, spirit and scope of this invention.

Accordingly, the foregoing description should not be read as pertaining only to the precise structures described and illustrated in the accompanying drawings, but rather should be read consistent with and as support to the following claims which are to have their fullest and fair scope.

We claim:

1. A resin composition comprising:
   a resin catalyst system including at least one epoxy resin and at least one cyanate ester resin and a catalyst having the formula:

wherein m and n are at least 1.
2. A resin composition as claimed in claim 1 wherein the epoxy resin comprises at least one aromatic epoxy resin.
3. A resin composition as claimed in claim 2 comprising at least one of bisphenol F epoxy resin or bisphenol A epoxy resin.
4. A resin composition as claimed in claim 1 wherein the cyanate ester resin comprises a polyfunctional cyanate ester resin.
5. A resin composition as claimed in claim 4 wherein the polyfunctional cyanate ester resin is selected from the group consisting of 1,1'-bis (4-cyanatophenyl) ethane, bis(4-cyanato-3,5-dimethylphenyl) methane, 2,2'-bis (4-cyanatophenyl) isopropylidene and mixtures thereof.
6. A resin composition as claimed in claim 1 wherein the epoxy resin is present in an amount of from about 5% to about 95% by weight of the resin system.
7. A resin composition as claimed in claim 1 wherein the epoxy resin is present in an amount of from about 10% to about 70% by weight of the resin system.
8. A resin composition as claimed in claim 1 wherein the epoxy resin is present in an amount of from about 30% to about 60% by weight of the resin system.
9. A resin composition as claimed in claim 1 wherein the cyanate ester resin is present in an amount of from about 5% to about 80% by weight of the resin system.
10. A resin composition as claimed in claim 1 wherein the cyanate ester resin is present in an amount of from about 10% to about 60% by weight of the resin system.
11. A resin composition as claimed in claim 1 wherein the cyanate ester resin is present in an amount of from about 20% to about 40% by weight of the resin system.
12. A resin composition as claimed in claim 1 wherein the catalyst is present in an amount of from about 5 parts to about 30 parts per 100 parts by weight of the resin system.
13. A resin composition as claimed in claim 1 wherein the catalyst is present in an amount of from about 7 parts to about 15 parts per 100 parts by weight of the resin system.
14. A resin composition as claimed in claim 1 which has a pot life of at least about 18 hours at 25° C.
15. A resin composition as claimed in claim 1 which is curable in 30 seconds at 200° C.
16. A resin composition as claimed in claim 1 which is curable in 15 seconds at 200° C.
17. A resin composition as claimed in claim 1 which is curable in 45 seconds at 200° C.
18. A resin composition as claimed in claim 1 which is snap curable at 200° C.
19. A resin composition as claimed in claim 1 which is stable at 25° C. for at least 24 hours.
20. A resin composition as claimed in claim 1 which is stable at 25° C. for at least one week.
21. A resin composition as claimed in claim 1 which is stable at 25° C. for at least two weeks.
22. A resin composition comprising:
    a resin system comprising at least one epoxy resin present in an amount of from about 5% to about 95% by weight of the resin system and at least one cyanate ester resin present in an amount of from about 5% to about 80% by weight of the resin system;
    a compound having the formula:

wherein m and n are at least 1, present in an amount of from about 5 to about 30 parts per 100 parts by weight of the resin system;

wherein the resin composition is stable at room temperature for at least about 18 hours at 25° C. and is curable in one minute or less at 200° C.

23. A resin composition as claimed in claim 22 wherein the epoxy resin comprises at least one aromatic epoxy resin.

24. A resin composition as claimed in claim 22, comprising at least one of bisphenol F epoxy resin or bisphenol A epoxy resin.

25. A resin composition as claimed in claim 22 wherein the cyanate ester resin comprises a polyfunctional cyanate ester resin.

26. A resin composition as claimed in claim 25 wherein the polyfunctional cyanate ester resin is selected from the group consisting of 1,1'-bis (4-cyanatophenyl) ethane, bis (4-cyanato-3,5-dimethylphenyl) methane, 2,2'-bis (4-cyanatophenyl) isopropylidene and mixtures thereof.

27. A resin composition as claimed in claim 22 wherein the epoxy resin is present in an amount of from about 10% to about 70% by weight of the resin system.

28. A resin composition as claimed in claim 22 wherein the epoxy resin is present in an amount of from about 30% to about 60% by weight of the resin system.

29. A resin composition as claimed in claim 22 wherein the cyanate ester resin is present in an a mount of from about 10% to about 60% by weight of the resin system.

30. A resin composition as claimed in claim 22 wherein the cyanate ester resin is present in an amount of from about 20% to about 40% by weight of the resin system.

31. A resin composition as claimed in claim 22 wherein the catalyst is present in an amount of from about 7 parts to about 15 parts per 100 parts by weight of the resin system.

32. A resin composition as claimed in claim 22 which is curable in 30 seconds at 200° C.

33. A resin composition as claimed in claim 22 which is curable in 15 seconds at 200° C.

34. A resin composition as claimed in claim 22 which is curable in 45 seconds at 145° C.

35. A resin composition as claim 22 which is stable at 25° C. for at least 24 hours.

36. A resin composition as claimed in claim 22 which is stable at 25° C. for at least one week.

37. A resin composition as claimed in claim 22 which is stable at 25° C. for at least two weeks.

38. A method for preparing a die attach adhesive comprising including in the die attach adhesive a resin composition according to claim 1.

39. A method for preparing a die attach adhesive comprising including in the die attach adhesive a resin composition according to claim 22.

40. A method for preparing a heat sink attach adhesive comprising including in the heat sink attach adhesive a resin composition according to claim 1.

41. A method for preparing a heat sink attach adhesive comprising including in the heat sink attach adhesive a resin composition according to claim 22.

42. A method for preparing an encapsulant comprising including in the encapsulant a resin composition according to claim 1.

43. A method for preparing an encapsulant comprising including in the encapsulant a resin composition according to claim 22.

44. A method for preparing an underfill comprising including in the underfill a resin composition according to claim 1.

45. A method for preparing an underfill comprising including in the underfill a resin composition according to claim 22.

* * * * *